United States Patent [19]

Honda

[11] Patent Number: 5,340,687
[45] Date of Patent: Aug. 23, 1994

[54] CHEMICALLY MODIFIED HYDROXY STYRENE POLYMER RESINS AND THEIR USE IN PHOTOACTIVE RESIST COMPOSITIONS WHEREIN THE MODIFYING AGENT IS MONOMETHYLOL PHENOL

[75] Inventor: Kenji Honda, Barrington, R.I.

[73] Assignee: OCG Microelectronic Materials, Inc., West Paterson, N.J.

[21] Appl. No.: 879,021

[22] Filed: May 6, 1992

[51] Int. Cl.$^5$ .................... G03F 7/023; G03F 7/30
[52] U.S. Cl. .................... 430/192; 430/165; 430/191; 430/193; 430/270; 528/152; 528/212; 525/134
[58] Field of Search ............... 430/191, 192, 193, 165, 430/326, 270; 528/212, 214, 152; 525/134

[56] References Cited

U.S. PATENT DOCUMENTS

| | | | |
|---|---|---|---|
| 2,994,686 | 8/1961 | Hauptschein | 528/212 |
| 3,318,658 | 5/1967 | Leahy et al. | 8/115.56 |
| 3,625,919 | 12/1971 | Kamogawa et al. | 260/47 U |
| 3,869,292 | 3/1975 | Peters | 96/115 R |
| 4,032,513 | 6/1977 | Fujiwara et al. | 260/47 UA |
| 4,376,000 | 3/1983 | Lindert | 148/6.15 R |
| 4,409,317 | 10/1983 | Shiraishi | 430/270 |
| 4,433,015 | 2/1984 | Lindert | 427/388.4 |
| 4,439,516 | 3/1984 | Cernigliaro et al. | 430/192 |
| 4,457,790 | 7/1984 | Lindert et al. | 148/6.15 R |
| 4,460,753 | 7/1984 | Yamamoto et al. | 528/159 |
| 4,465,768 | 8/1984 | Ueno et al. | 430/296 |
| 4,517,028 | 5/1985 | Lindert | 148/6.14 R |
| 4,554,237 | 11/1985 | Kataoka et al. | 430/197 |
| 4,600,683 | 7/1986 | Greco et al. | 430/270 |
| 4,614,706 | 9/1986 | Matsuzawa et al. | 430/313 |
| 4,828,958 | 5/1989 | Hayase et al. | 430/175 |
| 4,988,601 | 1/1991 | Ushirogouchi et al. | 430/192 |
| 5,002,858 | 3/1991 | Demmer et al. | 430/192 |

FOREIGN PATENT DOCUMENTS

| | | |
|---|---|---|
| 459260 | 12/1991 | European Pat. Off. |
| 5-043641 | 2/1993 | Japan |
| 5-107763 | 4/1993 | Japan |

OTHER PUBLICATIONS

Celanese Product Information Bulletin for Poly(p-hy-
(List continued on next page.)

*Primary Examiner*—Charles L. Bowers, Jr.
*Assistant Examiner*—John S. Chu
*Attorney, Agent, or Firm*—William A. Simons

[57] ABSTRACT

An alkali-soluble binder resin made by a condensation reaction of hydroxy styrene moiety having formulae (I) or (II):

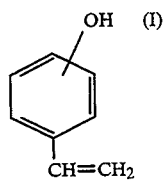 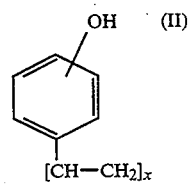

wherein x is an integer from 2 to 300; with a monomethylolated phenolic compound having a formula (III):

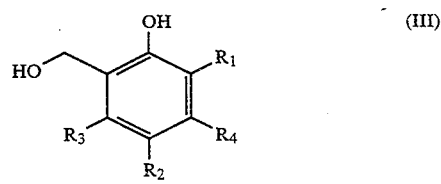

wherein $R_1$ and $R_2$ are individually selected from the group consisting of lower alkyl group having 1–4 carbon atoms, lower alkoxy group having 1–4 carbon atoms, amino group, and carboxylic acid group; wherein $R_3$ and $R_4$ are individually selected from the group consisting of hydrogen, lower alkyl group having 1–4 carbon atoms, lower alkoxy groups having 1–4 carbon atoms, an amino group, and a carboxylic group; and wherein the mole ratio of the hydroxy styrene moiety to the monomethylolated phenolic compound is from about 1:10 to about 10:1.

7 Claims, No Drawings

OTHER PUBLICATIONS droxystyrene), no date, Celanese Advanced Technology, Corpus Christi, Tex.

I. S. Fuksunaga, T. Kitaori, H. Koyanagi, S. Umeda and K. Nagasaiva; entitled "Diazonaphthequinone-sensitized Deep-UV Resist Materials", SPIE vol. 1672 Advances in Resist Technology and Processing IX (1992) pp. 647–659.

CHEMICALLY MODIFIED HYDROXY STYRENE POLYMER RESINS AND THEIR USE IN PHOTOACTIVE RESIST COMPOSITIONS WHEREIN THE MODIFYING AGENT IS MONOMETHYLOL PHENOL

BACKGROUND OF THE INVENTION

1. Field of the Invention

The present invention relates to selected chemically modified hydroxy styrene polymer resins and their use in photoactive resist compositions.

2. Brief Description of Prior Art

Photoresist compositions are used in microlithographic processes for making miniaturized electronic components such as in the fabrication of integrated circuits and printed wiring board circuitry. Generally, in the processes, a thin coating or film of a photoresist composition is first applied to a substrate material, such as silicon wafers used for making integrated circuits or aluminum or copper plates of printed wiring boards. The coated substrate is then baked to evaporate any solvent in the photoresist composition and to fix the coating onto the substrate. The baked coated surface of the substrate is next subjected to an image-wise exposure of radiation. This radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation-exposed or the unexposed areas of the coated surface of the substrate. In some instances, it may be desirable to bake the imaged coated substrate after the latent imaging step and before the developing step. This bake step is commonly called a post-exposure bake and is used to increase resolution.

There are two types of photoresist compositions——negative-working and positive-working. When negative-working photoresist compositions are exposed image-wise to radiation, the areas of the resist composition exposed to the radiation become less soluble to a developer solution (e.g., a cross-linking reaction occurs) while the unexposed areas of the photoresist coating remain relatively soluble to a developing solution. Thus, treatment of an exposed negative-working resist with a developer solution causes removal of the nonexposed areas of the resist coating and the creation of a negative image in the photoresist coating, and thereby uncovering a desired portion of the underlying substrate surface on which the photoresist composition is deposited. On the other hand, when positive-working photoresist compositions are exposed image-wise to radiation, those areas of the resist composition exposed to the radiation become more soluble to the developer solution (e.g., a rearrangement reaction occurs) while those areas not exposed remain relatively insoluble to the developer solution. Thus, treatment of an exposed positive-working resist with the developer solution causes removal of the exposed areas of the resist coating and the creation of a positive image in the photoresist coating. Again, a desired portion of the underlying substrate surface is uncovered.

After this development operation, the now partially unprotected substrate may be treated with a substrate-etchant solution or plasma gases and the like. This etchant solution or plasma gases etch the portion of the substrate where the photoresist coating is removed during development. The areas of the substrate where the photoresist coating still remains are protected and, thus, an etched pattern is created in the substrate material which corresponds to the photomask used for the image-wise exposure of the radiation. Later, the remaining areas of the photoresist coating may be removed during a stripping operation, leaving a clean etched substrate surface. In some instances, it is desirable to heat treat the remaining resist layer after the development step and before the etching step to increase its adhesion to the underlying substrate and its resistance to etching solutions.

Positive-working photoresists are generally prepared by blending a suitable alkali-soluble binder resin (e.g., a phenol-formaldehyde novolak resin) with a photoactive compound (PAC) which converts from being insoluble to soluble in an alkaline aqueous developer solution after exposure to a light or energy source. The most common class of PAC's employed today for positive-working resists are quinone diazide esters of a polyhydroxy compound. Typical novolak resins used today for positive-working resins are made from various mixtures of ortho-cresol, meta-cresol, and para-cresol which are condensed with an aldehyde source (e.g., formaldehyde). The combination of xylenols with such ortho-, meta-, and para-cresol mixtures are also used in making novolak resins.

Novolaks made from mixtures of meta-cresol and para-cresol are particularly popular as binder resins for positive photoresists. They provide good lithographic performance with quinone diazide ester sensitizers. However, one deficiency of such novolak resins is their relatively wide molecular weight distribution.

In comparison, other types of alkaline-soluble polymers have also been looked at as binder resins for photoresists. For example, hydroxy styrene polymers, hydrolyzed styrene-maleic anhydride copolymers, styrene-maleimide copolymers and other polymers of styrene derivatives have been tested for lithographic performance.

None of these polymers are useful alone in commercial photoresists because of their extremely high solubility in alkali developers used in the lithographic process. However, they do have the advantage of having a narrower molecular weight distribution compared to novolaks which results in a sharper switching of dissolution of the polymers in alkali developers.

In the past, poly(hydroxy styrene) has been modified in various ways [see Information Bulletin of Poly(p-hydroxy styrene) published by R. W. Rupp and B. N. Shah, Celanese Advanced Technology]. In particular to reduce the alkali dissolution rate of poly(hydroxy styrene) polymers, the research staff at Hoechst AG has examined alkylation of such polymers particularly at the ortho position to the hydroxy group on the phenolic ring (EP 307-752, 1989; Proc. SPIE Vol. 1262, Advances in Resist Technology and Processing VII, 391–400, 1990). However, the resulting polymers still have a poor property of dissolution inhibition with quinone diazide ester photoactive sensitizers compared with conventional novolak polymers, according to Hitachi research group (see Proc. 4th Micro Process Conference held at Kanazawa, Japan, Jul. 15–18, 1991; A-7-3).

The present invention provides a way of obtaining the advantages of the cresol novolak chemistry along with the alkali-solubility characteristics of poly (hydroxy styrene) polymers to obtain a polymer resin having a predetermined narrow molecular weight distribution. These binder resins of the present invention have (1) good dissolution inhibition of binder resin with quinone diazide ester sensitizers, (2) good discrimination in dissolution rate between exposed and unexposed areas, (3) substantially perpendicular walls of photo image, and (4) no scum.

BRIEF SUMMARY OF THE INVENTION

Accordingly, the present invention is directed to an alkali-soluble binder resin made by a condensation reaction of hydroxy styrene moiety having formulae (I) or (II):

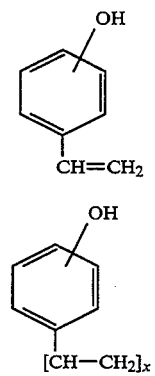

wherein x is an integer from 2 to 300; with a monomethylolated phenolic compound having a formula (III):

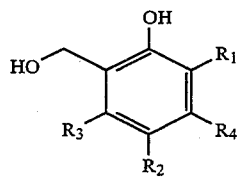

wherein $R_1$ and $R_2$ are individually selected from the group consisting of lower alkyl group having 1–4 carbon atoms, lower alkoxy group having 1–4 carbon atoms, amino group, and carboxylic acid group; wherein $R_3$ and $R_4$ are individually selected from the group consisting of hydrogen, lower alkyl group having 1–4 carbon atoms, lower alkoxy groups having 1–4 carbon atoms, an amino group, and a carboxylic group; and wherein the mole ratio of the hydroxy styrene moiety to the monomethylolated phenolic compound is from about 1:10 to about 10:1.

Furthermore, the present invention is directed to a radiation-sensitive composition useful as a positive working photoresist dissolved in a solvent comprising:

A. a photoactive compound;

B. an alkali-soluble binder resin, as described above; wherein the photoactive compound makes up from about 5% to about 40% by weight of the solids of said radiation-sensitive composition; and the alkali-soluble binder resin makes up from about 95% to about 60% by weight of the solids in said radiation-sensitive composition.

If a compound of formula (I) is reacted with a compound of formula (III), as described above, it is preferred that the resulting oligomer be further polymerized by itself or with other comonomers to increase its molecular weight and thus obtain better lithographic performance.

DETAILED DESCRIPTION

The hydroxy styrene moieties of formula (I) are commercially available materials. The preferred hydroxy styrene moiety of formula (I) is para-hydroxy styrene.

The poly(hydroxy styrene) polymers of formula (II) are commercially available materials. The preferred poly(hydroxy styrene) polymer of formula (II) is poly(-para-hydroxy styrene) with n being from about 10 to 100. The preferred molecular weight of the poly(hydroxy styrene) is from 3,000–30,000, more preferably, 5,000–8,000.

The monomethylolated phenolic compound precursors of formula (III) are prepared by reacting the corresponding phenol having the 6-position unsubstituted with formaldehyde in the presence of an alkaline medium. Suitable alkaline mediums include aqueous solution of sodium hydroxide or tetramethylammonium hydroxides. The 2- and 4-position substituent groups should be small because if bulky substituents may lead to the resulting polymer having a distorted conformation which may lead to less effective dissolution inhibition with quinone diaxide esters. Lower alkyl groups having 1-2 carbon atoms and lower alkoxy groups having 1-2 carbon atoms are preferred for $R_2$ and $R_2$. Methyl groups are most preferred for $R_1$ and $R_2$. Hydrogen groups are preferred for both $R_3$ and $R_4$. Thus 2,4-dimethyl-6-methylolphenol is the most preferred monomethylolated phenolic compound. The monomethylolation reaction should preferably be controlled to avoid any further dimerization or polymerization. To do that, a large excess of formaldehyde should be reacted with the 2,4-substituted phenolic compound and the reaction temperature should preferably not exceed about 70°–80° C. The reaction time for this methylolation reaction is preferably 1–3 hours.

The hydroxystyrene precursors (I) or the poly(hydroxy styrene) precursors (II), particularly poly (p-hydroxy styrene), may be reacted with a monomethylolated phenolic compound of formula (III) in the presence of acid catalyst at an elevated temperature around 40°–80° C. The preferred acidic catalysts are oxalic acid or HCl. Preferably, these reactions are carried out in an organic solvent which dissolves both reactive precursors. One preferred solvent is 1-methoxy-2-propanol. The preferred molar ratio of the hydroxystyrene moiety of formula (I) to the monomethylolated precursor (III) is from about 1:1 to about 1:3, most preferably about 1:2. The preferred molar ratio of each repeating unit of the poly(hydroxy styrene) precursor (II) to the monomethylolated precursor (III) is also from about 1:1 to about 1:3, most preferably about 1:2. The reaction time may vary considerably, preferably from about 4 to about 24 hours. The reaction products for each reaction may be recovered by any conventional means. Recovery means such as recrystallization or reprecipitation are suitable recovery methods.

The hydroxy styrene monomers modified with the monomethylolated precursor form the trimeric oligomer of formula (IV):

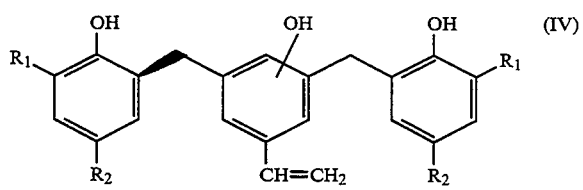

The oligomer (IV) could be further polymerized by any method for the vinyl polymerization such as radical polymerization, cation polymerization, anion polymerization, plasma polymerization, and so on. However, due to the steric hindrance and the chain termination with the reactive phenolic hydroxy group attached onto the oligomer, the polymerization might hardly take place. In particular, to avoid the chain termination reaction of a growing polymer chain radical on the vinyl group of the oligomer with the reactive hydroxy group on the same molecule, the cation polymerization would be recommended in which the following polymerization initiators may be used to make a polymer having desired molecular weight, molecular weight distribution, and microstructures suitable to the improved dissolution inhibition. Thus, recommended initiators for the polymerization are $BF_3$-$Et_2O$, $AlCl_3$, $TiCl_4$, $SnCl_4$, $H_2SO_4$, $H_3PO_4$, $CF_3COOH$, and other Lewis acids or protonic acids.

Other reaction conditions for the polymerization are similar to the previously published method for the cation polymerization of hydroxy styrene derivatives: Refer to Japanese Patent No. 46,021,213 (1971) or U.S. Pat. No. 4,032,513 (1989).

If the oligomer (IV) is copolymerized with other comonomers, the following vinyl monomers are useful: acrylic acid, methacrylic acid, methyl acrylate, methyl methacrylate, maleic anhydride, vinyl acetate, acrylonitrile, acrylamide, methacrylamide, and other monomers containing a polar group.

The above-discussed resins of the present invention may be mixed with photoactive compounds to make radiation-sensitive mixtures which are useful as positive working photoresists. One preferred class of photoactive compounds (sometimes called sensitizers) is o-quinonediazide compounds particularly esters derived from polyhydroxy phenols, alkyl-polyhydroxyphenols, aryl-polyhydroxyphenols, and the like which can contain up to six or more sites for esterification. The most preferred o-quinonediazide esters are derived from o-naphthoquinone-1,2-diazide-4-sulfonic acid and o-naphthoquinone-1,2-diazide-5-sulfonic acid.

Specific examples include resorcinol 1,2-naphthoquinonediazide-4-sulfonic acid esters; pyrogallol 1,2-naphthoquinonediazide-5-sulfonic acid esters, 1,2-quinonediazidesulfonic acid esters of (poly)hydroxyphenyl alkyl ketones or (poly)hydroxyphenyl aryl ketones such as 2,4-dihydroxyphenyl propyl ketone 1,2-benzoquinonediazide-4-sulfonic acid esters, 2,4,dihydroxyphenyl hexyl ketone 1,2-naphthoquinonediazide-5-sulfonic acid esters, 2,4-dihydroxybenzophenone 1,2-naphthoquinonediazide-5-sulfonic acid esters, 2,3,4-trihydroxyphenyl hexyl ketone 1,2-naphthoquinonediazide-4-sulfonic acid esters, 2,3,4-trihydroxybenzophenone 1,2-naphthoquinonediazide-4-sulfonic acid esters, 2,3,4-trihydroxybenzophenone 1,2-naphthoquinonediazide-5-sulfonic acid esters, 2,4,6-trihydroxybenzophenone 1,2-naphthoquinonediazide-4-sulfonic acid esters, 2,4,6-trihydroxybenzophenone 1,2-naphthoquinonediazide-5-sulfonic acid esters, 2,3,4,4'-tetrahydroxybenzophenone 1,2-naphthoquinonediazide-5-sulfonic acid esters, 2,3,4,4'-tetrahydroxybenzophenone 1,2-naphthoquinone-diazide-4-sulfonic acid esters, 2,2',3,4',6'-pentahydroxybenzophenone 1,2-naphthoquinonediazide-5-sulfonic acid esters and 2,3,3',4,4',5'-hexahydroxybenzophenone 1,2-naphthoquinonediazide-5-sulfonic acid esters; 1,2-quinonediazidesulfonic acid esters of bis[(poly)hydroxyphenyl]alkanes such as bis(p-hydroxyphenyl)methane 1,2-naphthoquinonediazide-4-sulfonic acid esters, bis(2,4-dihydroxyphenyl)methane 1,2-naphthoquinonediazide-5-sulfonic acid esters, bis(2,3,4-trihydroxyphenyl)methane 1,2-naphthoquinonediazide-sulfonic acid esters, 2,2-bis(p-hydroxyphenyl)propane 1,2-naphthoquinonediazide-4-sulfonic acid esters, 2,2-bis(2,4-dihydroxyphenyl)propane 1,2-naphthoquinonediazide-sulfonic acid esters, 2,2-bis(2,3,4-trihydroxyphenyl)propane 1,2-naphthoquinonediazide-sulfonic acid esters, 2,6-bis-[(2,3,4-trihydroxyphenyl)methyl]-4-methylphenol 1,2-naphthoquinonediazide-5-sulfonic acid esters, and 2,6-bis[2,4,6-trihydroxyphenyl)methyl]-4-methylphenol 1,2-naphthoquinonediazide-5-sulfonic acid esters. Besides the 1,2-quinonediazide compounds exemplified above, there can also be used the 1,2-quinonediazide compounds described in J. Kosar, "Light-Sensitive Systems", 339–352 (1965), John Wiley & Sons (New York) or in S. DeForest, "Photoresist", 50, (1975), MacGraw-Hill, Inc. (New York). In addition, these materials may be used in combinations of two or more. Further, mixtures of substances formed when less than all esterification sites present on a particular polyhydroxyphenol, alkyl-polyhydroxyphenol, aryl-polyhydroxyphenol and the like have combined with o-quinonediazides may be effectively utilized in positive working photoresists.

Of all the 1,2-quinonediazide compounds mentioned above, 1,2-naphthoquinonediazide-5-sulfonic di-, tri-, tetra-, penta- and hexa-esters of polyhydroxy compounds having at least 2 hydroxy groups, i.e. about 2 to 6 hydroxy groups, are most preferred.

Among these most p referred 1,2-naphthoquinone-5-diazide compounds are 2,3 ,4-trihydroxybenzophenone 1,2-naphthoquinonediazide-5 -sulfonic acid esters; 2,2',4,4'-tetrahydroxybenzophenone 1,2-naphthoquinonediazide-5-sulfonic acid esters; 2,6-bis-[(2,3,4-trihydroxyphenyl)methyl]-4-methylphenol 1,2-naphthoquinonediazide-5-sulfonic acid esters; and 2,6-bis[2,4,6-trihydroxyphenyl)methyl]-4-methylphenol 1,2-naphthoquinonediazide-5-sulfonic acid esters. These 1,2-quinonediazide compounds may be used alone or in combination of two or more.

Another preferred 1,2-naphthoquinone-5-diazide compounds are phenol 1,2-naphthoquinonediazide-5-sulfonic acid ester and bis[4-(2,6-dimethylphenol)]-4-catehol methane 1,2-naphthoquinone-5-diazide sulfonic acid esters.

The proportion of the sensitizer compound in the radiation-sensitive mixture may preferably range from about 5 to about 40%, more preferably from about 10 to about 25% by weight of the solids or nonvolatile (e.g., nonsolvent) content of the radiation-sensitive mixture. The proportion of total binder resin of this present invention in the radiation-sensitive mixture may preferably range from about 60 to about 95%, more preferably, from about 75 to 90% of the solids or nonvolatile (e.g., excluding solvents) content of the radiation-sensitive mixture.

These radiation-sensitive mixtures may also contain conventional photoresist composition ingredients such as other resins, solvents, actinic and contrast-enhancing dyes, anti-striation agents, plasticizers, speed enhancers, and the like. These additional ingredients may be added to the binder resin and sensitizer solution before the solution is coated onto the substrate.

Other binder resins may also be added beside the resins of the present invention mentioned above. Examples include phenolic-formaldehyde resins, cresolformaldehyde resins, phenol-cresol-formaldehyde resins and poly(hydroxy styrene) resins commonly used in the photoresist art. Haloacetaldehyde and other aldehyde sources may be used instead of formaldehyde for making these optional resins. If other binder resins are present, they will replace a portion of the binder resins of the present invention. Thus, the total amount of the binder resin in the radiation-sensitive composition will be from about 60% to about 95% by weight of the total nonvolatile solids content of the radiation-sensitive composition.

The resins and sensitizers are generally dissolved in a solvent or solvents to facilitate their application to the substrate. Examples of known photoresist solvents include methoxyacetoxy propane, ethyl cellosolve acetate, n-butyl acetate, cyclopentanone, cyclohexanone, methyl ethyl ketone, diglyme, ethylene glycol monomethyl ether, ethylene glycol monoethyl ether, methyl lactate, ethyl lactate, ethyl 3-ethoxy propionate, propylene glycol alkyl ether acetates, xylene, or mixtures thereof and the like. The preferred solvent is ethyl lactate alone or in combination with ethyl 3-ethoxy propionate. The preferred amount of solvent may be from about 50 to about 500%, or higher, by weight, more preferably, from about 100 to about 400% by weight, based on combined resin and sensitizer weight.

Actinic dyes help provide increased resolution on highly reflective surfaces by inhibiting back scattering of light off the substrate. This back scattering causes the undesirable effect of optical notching, especially on a substrate topography. Examples of actinic dyes include those that absorb light energy at approximately 400–460 nm [e.g., Fat Brown B (C.I. No. 12010); Fat Brown RR (C.I. No. 11285); 2-hydroxy-1,4-naphthoquinone (C.I. No. 75480) and Quinoline Yellow A (C.I. No. 47000)] and those that absorb light energy at approximately 300–340 nm [e.g., 2,5-diphenyloxazole (PPO-Chem. Abs. Reg. No. 92-71-7) and 2-(4-biphenyl)-6-phenylbenzoxazole (PBBO-Chem. Abs. Reg. No. 17064-47-0)]. The amount of actinic dyes may be up to 10% weight levels, based on the combined weight of resin and sensitizer.

Contrast dyes enhance the visibility of the developed images and facilitate pattern alignment during manufacturing. Examples of contrast dye additives that may be used together with the radiation-sensitive mixtures of the present invention include Solvent Red 24 (C.I. No. 26105), Basic Fuchsin (C.I. No. 42514), Oil Blue N (C.I. No. 61555) and Calco Red A (C.I. No. 26125) up to 10% weight levels, based on the combined weight of resin and sensitizer.

Anti-striation agents level out the photoresist coating or film to a uniform thickness. Anti-striation agents may be used up to 5% weight levels, based on the combined weight of resin and sensitizer. One suitable class of anti-striation agents is nonionic silicon-modified polymers. Nonionic surfactants may also be used for this purpose, including, for example, nonylphenoxy poly-(ethyleneoxy) ethanol; octylphenoxy (ethyleneoxy) ethanol; and dinonyl phenoxy poly(ethyleneoxy) ethanol.

Plasticizers improve the coating and adhesion properties of the photoresist composition and better allow for the application of a thin coating or film of photoresist which is smooth and of uniform thickness onto the substrate. Plasticizers which may be used include, for example, phosphoric acid tri-($\beta$-chloroethyl)-ester; stearic acid; dicamphor; polypropylene; acetal resins; phenoxy resins; and alkyl resins up to 10% weight levels, based on the combined weight of resin and sensitizer.

Speed enhancers tend to increase the solubility of the photoresist coating in both the exposed and unexposed areas, and thus, they are used in applications where speed of development is the overriding consideration even though some degree of contrast may be sacrificed, i.e., in positive resists while the exposed areas of the photoresist coating will be dissolved more quickly by the developer, the speed enhancers will also cause a larger loss of photoresist coating from the unexposed areas. Speed enhancers that may be used include, for example, picric acid, nicotinic acid or nitrocinnamic acid at weight levels of up to 20%, based on the combined weight of resin and sensitizer. Other known speed enhancers include polyhydroxy compounds such as resorcinol, phloroglucinol, 2,3,4-trihydroxybenzophenone, 2,3,4,4'-tetrahydroxybenzophenone, 2,3,4,3',4',5'-hexahydroxy-benzophenone, acetone pyrogallol condensate resins, and the like. Preferred speed enhancers include 2,6-bis[(2,3,4-trihydroxyphenyl)methylene]-4-methylphenol and 1-[1'methyl-1'-(4'-hydroxyphenyl)ethyl] 4-[1',1'-bis(4-hydroxyphenyl)ethyl] (also known as phenol, 4,4'-[1-[4-[1-(4-hydroxyphenyl)-1-methylethyl]phenyl]ethylidene]bis- or TRISP-PA). (This latter compound has CAS No. 110 726-28-8.)

The prepared radiation-sensitive resist mixture, can be applied to a substrate by any conventional method used in the photoresist art, including dipping, spraying, whirling, and spin coating. When spin coating, for example, the resist mixture can be adjusted as to the percentage of solids content in order to provide a coating of the desired thickness given the type of spinning equipment and spin speed utilized and the amount of time allowed for the spinning process. Suitable substrates include silicon, aluminum or polymeric resins, silicon dioxide, doped silicon dioxide, silicon resins, gallium arsenide, silicon nitride, tantalum, copper, polysilicon, ceramics and aluminum/copper mixtures.

The photoresist coatings produced by the above described procedure are particularly suitable for application to thermally grown silicon/silicon dioxide-coated wafers such as are utilized in the production of microprocessors and other miniaturized integrated circuit components. An aluminum/aluminum oxide wafer can be used as well. The substrate may also comprise various polymeric resins especially transparent polymers such as polyesters and polyolefins.

After the resist solution is coated onto the substrate, the coated substrate is baked at approximately 70° to 125° C. until substantially all the solvent has evaporated and only a uniform light-sensitive coating remains on the substrate.

The coated substrate can then be exposed to radiation, especially ultraviolet radiation, in any desired exposure pattern, produced by use of suitable masks, negatives, stencils, templates, and the like. Conventional imaging process or apparatus currently used in processing photoresist-coated substrates may be employed with the present invention. In some instances, a post-exposure bake at a temperature about 10° C. higher than the soft bake temperature is used to enhance image quality and resolution.

The exposed resist-coated substrates are next developed in an aqueous alkaline developing solution. This solution is preferably agitated, for example, by nitrogen gas agitation. Examples of aqueous alkaline developers include aqueous solutions of tetramethylammonium hydroxide, sodium hydroxide, potassium hydroxide, ethanolamine, choline, sodium phosphates, sodium carbonate, sodium metasilicate, and the like. The preferred developers for this invention are aqueous solutions of either alkali metal hydroxides, phosphates or silicates, or mixtures thereof, or tetramethylammonium hydroxide.

Alternative development techniques such as spray development or puddle development, or combinations thereof, may also be used.

The substrates are allowed to remain in the developer until all of the resist coating has dissolved from the exposed areas. Normally, development times from about 10 seconds to about 3 minutes are employed.

After selective dissolution of the coated and imaged wafers in the developing solution, they are preferably subjected to a deionized water rinse to fully remove the developer or any remaining undesired portions of the coating and to stop further development. This rinsing operation (which is part of the development process) may be followed by blow drying with filtered air to remove excess water. A post-development heat treatment or bake may then be employed to increase the coating's adhesion and chemical resistance to etching solutions and other substances. The post-development heat treatment can comprise the baking of the coating and substrate below the coating's thermal deformation temperature.

In industrial applications, particularly in the manufacture of microcircuitry units on silicon/silicon dioxide-type substrates, the developed substrates may then be treated with a buffered, hydrofluoric acid etching solution or plasma gas etch.

Later, the remaining areas of the photoresist coating may be removed from the etched substrate surface by conventional photoresist stripping operations.

The present invention is further described in detail by means of the following Examples. All parts and percentages are by weight unless explicitly stated otherwise.

REFERENCE 1

One mole of 2,4-dimethylphenol and 25% tetramethylammonium hydroxide aqueous solution (1.25 moles of hydroxide ion) was charged in a one-liter, three-necked, round-bottom flask equipped with a stirrer, condenser, and thermometer. The reaction mixture was heated up to 60° C. with mechanical stirring to be dissolved. 37% of Formalin (4.0 moles of formaldehyde) was then slowly added in 10-15 minutes. The reaction mixture was heated at 70° C. for the first hour and then the temperature went down to 45° C., while keeping the reaction mixture stirred for 2-3 hours at 45° C.

29% Ammonium hydroxide (1.5 moles) was slowly added allowing the temperature to reach a maximum of 50° C. The reaction solution was cooled down to room temperature and 1.25 moles of glacial acetic acid was added to precipitate the product. Yield was 65% and purity of the product 96%.

EXAMPLES 1-3

One mole of poly(p-hydroxy styrene) having an average molecular weight of 7,000 produced at Maruzen Petrochemical Co., Ltd. in Japan was placed with a minimum amount of solvent, 1-methoxy-2-propanol, to dissolve the polymer and concentrated HCl (1/10 moles of the monomethylolated precursor charged) in a three-necked, round bottom flask equipped with a condenser, thermometer, and mechanical stirrer. Various moles (see Table 1) of the monomethylolated precursor of Reference Example 1 were dissolved in a minimum amount of the same solvent slowly added to the reaction mixture keeping the reaction temperature below 45° C. The reaction solution was then maintained at 40°-45° C. for 2-3 hours. The solution was then heated up to 200° C. in an oil bath to remove the solvent.

The alkali dissolution rate of thus modified poly(p-hydroxy styrene) was reasonably reduced, and the dissolution inhibition of these polymers was much increased by the chemical modification described above in comparison with the dissolution inhibition of unmodified poly(hydroxy styrene), as shown in Table 1.

TABLE 1

| Example | Precursor/Polymer[*1] | Yield[*2] | Relative Dissolution Rate[*3] |
|---|---|---|---|
| 1 | 1.0 | 86 | 70 |
| 2 | 1.5 | 90 | 200 |
| 3 | 2.0 | 89 | 1,000 |

[*1] A molar ratio of the precursor phenolic unit to the polymer phenolic unit in feed.
[*2] A weight percent of the product to the total amounts of the polymer and precursor in feed.
[*3] A ratio of the alkali dissolution rate of thus modified polymers to that of unmodified polymer in an alkali developer.

While the invention has been described above with reference to specific embodiments thereof, it is apparent that many changes, modifications, and variations can be made without departing from the inventive concept disclosed herein. Accordingly, it is intended to embrace all such changes, modifications, and variations that fall within the spirit and broad scope of the appended claims. All patent applications, patents, and other publications cited herein are incorporated by reference in their entirety.

What is claimed is:

1. An alkali-soluble binder resin made by a condensation reaction consisting of reacting a hydroxy styrene moiety having formulae (I) or (II):

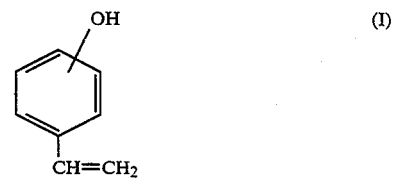

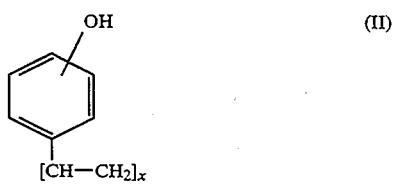

wherein x is an integer from 2 to 3001 with a monomethylolated phenolic compound having a formula (III):

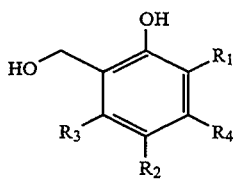 (III)

wherein $R_1$ and $R_2$ are individually selected from the group consisting of lower alkyl group having 1–4 carbon atoms, lower alkoxy group having 1–4 carbon atoms, amino group, and carboxylic acid group; wherein $R_3$ and $R_4$ are individually selected from the group consisting of hydrogen, lower alkyl group having 1–4 carbon atoms, lower alkoxy groups having 1–4 carbon atoms, an amino group, and a carboxylic group; and wherein the mole ratio of the hydroxy styrene moiety to the monomethylolated phenolic compound is from about 1:10 to about 10:1.

2. The alkali-soluble novolak binder resin of claim 1 wherein said hydroxy styrene is poly(parahydroxy styrene).

3. The alkali-soluble novolak binder resin of claim 1 wherein said methylolated phenolic compound is 2,4-dimethyl-6-methylolphenol.

4. A radiation-sensitive composition dissolved in a solvent comprising an admixture:
(a) a photoactive compound;
(b) an alkali-soluble binder resin made by a condensation reaction of hydroxy styrene moiety having formulae (I) or (II):

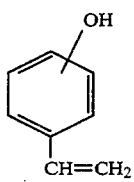 (I)

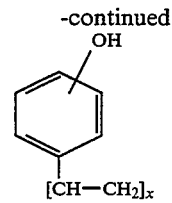 (II)

wherein x is an integer from 2 to 300; with a monomethylolated phenolic compound having a formula (III):

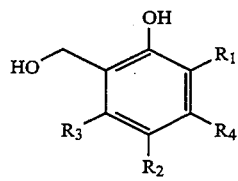 (III)

wherein $R_1$ and $R_2$ are individually selected from the group consisting of lower alkyl group having 1–4 carbon atoms, lower alkoxy group having 1–4 carbon atoms, amino group, and carboxylic acid group; wherein $R_3$ and $R_4$ are individually selected from the group consisting of hydrogen, lower alkyl group having 1–4 carbon atoms, lower alkoxy groups having 1–4 carbon atoms, an amino group, and a carboxylic group; and wherein the mole ratio of the hydroxy styrene moiety to the monomethylolated phenolic compound is from about 1:10 to about 10:1 wherein the photoactive compound makes up from about 5% to about 40% by weight of the solids of said radiation-sensitive composition; and the alkali-soluble novolak resin makes up from about 95% to about 60% by weight of the solids in said radiation-sensitive composition.

5. The radiation-sensitive composition of claim 4 wherein said hydroxy styrene is poly(parahydroxy styrene).

6. The radiation-sensitive composition of claim 4 wherein said monomethylolated phenolic compound is 2,4-dimethyl-6-methylolphenol.

7. The radiation-sensitive composition of claim 1 wherein said photoactive compound is an o-quinonediazide compound.

* * * * *